United States Patent
Yoshimura

(10) Patent No.: US 7,304,389 B2
(45) Date of Patent: Dec. 4, 2007

(54) SEMICONDUCTOR DEVICE AND SUPPORTING PLATE

(75) Inventor: Hideaki Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/064,948

(22) Filed: Feb. 25, 2005

(65) Prior Publication Data

US 2005/0151234 A1    Jul. 14, 2005

Related U.S. Application Data

(63) Continuation of application No. PCT/JP03/00917, filed on Jan. 30, 2003.

(51) Int. Cl.
H01L 23/48    (2006.01)
H01L 23/52    (2006.01)
H01L 29/40    (2006.01)

(52) U.S. Cl. .................. 257/774; 257/712; 257/786

(58) Field of Classification Search ............. 257/704, 257/706, 773, 778, 712, 721, 730, 731, 774, 257/786, E23.011, E23.067, E23.145, E23.174, 257/E21.577, E33.075, E31.131, E23.051
See application file for complete search history.

(56) References Cited

U.S. PATENT DOCUMENTS

| 6,232,652 | B1 * | 5/2001 | Matsushima | ............. 257/667 |
| 6,303,871 | B1 | 10/2001 | Zu et al. | |
| 6,383,846 | B1 * | 5/2002 | Shen et al. | ............. 438/127 |

FOREIGN PATENT DOCUMENTS

| JP | 10-50770 | 2/1998 |
| JP | 11-186438 | 7/1999 |
| JP | 2000-286363 | 10/2000 |
| JP | 2000-349178 | 12/2000 |
| JP | 2001-15643 | 1/2001 |
| JP | 2001-196490 | 7/2001 |

* cited by examiner

*Primary Examiner*—Hoai Pham
*Assistant Examiner*—Dilinh Nguyen
(74) *Attorney, Agent, or Firm*—Staas & Halsey LLP

(57) ABSTRACT

A semiconductor device includes a semiconductor element, a resin substrate where the semiconductor element is mounted, and a supporting plate configured to support the resin substrate. A first gas discharging hole is made through the supporting plate. Gas generated from the resin substrate is discharged through the first gas discharging hole.

4 Claims, 4 Drawing Sheets

SEMICONDUCTOR DEVICE AND SUPPORTING PLATE

CROSS-REFERENCE TO RELATED APPLICATION

This application is a U.S. continuation application filed under 35 USC 111(a) and claiming benefit under 35 USC 120 and 365(c) of PCT application No. JP2003/000917 filed on Jan. 30, 2003. The foregoing application is hereby incorporated by reference.

BACKGROUND OF THE INVENTION

1. Field of the Invention

The present invention generally relates to semiconductor devices and supporting plates, and more particularly, to a semiconductor device having a resin substrate where a conductive element is mounted and a supporting plate.

2. Description of the Related Art

A BGA (Ball Grid Array) package or an LGA (Land Grid Array) package, for example, has a structure wherein a semiconductor element is mounted on an upper surface of a resin substrate and an external connection terminal such as a solder ball or a land is provided on a lower surface of the resin substrate.

FIG. 1 is a front view of a related art semiconductor device 10, and FIG. 2 is a plan view of the semiconductor device 10. For the convenience of explanation, a cross section of a stiffener 14 is shown in FIG. 1.

The semiconductor device 10 shown in FIG. 1 and FIG. 2 has a BGA package structure. In the semiconductor device 10, a semiconductor element 11 is mounted on the center of an upper surface of a resin substrate 12. Plural solder balls 13 as external connection terminals are provided on a lower surface of the resin substrate 12. In the example shown in FIG. 1 and FIG. 2, the semiconductor element 11 is flip-chip connected to the resin substrate 12.

The resin substrate 12 is formed as a multilayer wiring substrate. More specifically, the resin substrate 12 has a structure where wiring layers, via forming part interfacially connecting the wiring layers, and others are formed in a base material made of an organic resin material. The semiconductor element 11 and the solder balls 13 are electrically connected to each other by the wiring layer formed in the resin substrate 12 and the via forming parts.

In the meantime, the semiconductor device 10 may be mounted on a mounting substrate in a state where the semiconductor device 10 is installed in a BGA socket. In this case, if a deformation such as a curve or bending happens to the resin substrate 12, all of the solder balls 3 may not be connected to an electrode of the socket. Because of this, a high co-planarity (flatness) is required of the resin substrate 12.

In addition, when the semiconductor element 11 is flip-chip connected to the resin substrate 12 as described above, if the deformation such as the curve or bending happens to the resin substrate 12, plural bumps (not shown in FIG. 1 and FIG. 2) formed in the semiconductor element 11 may not be connected to the resin substrate 12.

The stiffener 14 is provided at the resin substrate 12 to solve the above-mentioned problems. As shown in FIG. 2, the stiffener 14 has an area having a substantially same size as the resin substrate 12. An opening part 16 is formed in the center of the stiffener 14 so that the semiconductor element 11 can be mounted on the resin substrate 12 in the opening part 16.

The stiffener 14 is a member having a plate-shaped configuration and formed by a metal material. The stiffener 14 is adhered to the resin substrate 12 by using a resin adhesive 15. Accordingly, the resin substrate 12 is supported by the stiffener 14 and thereby co-planarity (flatness) can be maintained.

However, recently and continuing, the number of pins is increasing as the semiconductor elements 11 are provided with higher densities. Therefore, the number of the external connection terminals (solder balls 13) is also increasing. In addition, as the number of the external connection terminals is increasing, the size of the package (resin substrate 12) is becoming larger. Thus, as the size of the semiconductor device 10 becomes larger, the size of the stiffener 14 becomes large so that an adhesive area of the resin substrate 12 and the stiffener 14 is increasing.

On the other hand, since the resin substrate 12 is made of the organic resin material, some degree of moisture absorption is generated. In addition, similarly, since the resin adhesive 15 is made of the organic resin, some degree of moisture absorption is generated. The absorbed moisture is vaporized and gasified by a heating process implemented when the solder ball 13 is mounted on the mounting substrate. When the absorbed moisture is gasified, a large amount of a volumetric expansion may occur.

In a case where the number of the external connection terminals is small and therefore configurations of the resin substrate 12 and the stiffener 14 are small, the generated gas can escape to a side of a periphery of the stiffener 14 or a side of the opening part 16. However, in a case where the size of the stiffener 14 becomes large as the size of the semiconductor device 10 becomes larger, so that the adhesive area of the resin substrate 12 and the stiffener 14 is increasing, there is no path for the escape of the generated gas.

Therefore, there are problems in the related art that damage such as inter layer peeling or disconnection may be generated in the resin substrate 12 and peeling may be generated at a connection part between the resin substrate 12 and the stiffener 14, and therefore reliability of the semiconductor device 10 is decreased.

SUMMARY OF THE INVENTION

Accordingly, it is a general object of the present invention to provide a novel and useful semiconductor device and supporting plate, in which one or more of the problems described above are eliminated.

Another and more specific object of the present invention is to provide a semiconductor device and supporting plate which can prevent damage due to gasification of a moisture-absorbing component even if the size of the package is increased and thereby the size of the supporting plate (stiffener) is increased.

The above object of the present invention is achieved by a semiconductor device, including:

a semiconductor element;

a resin substrate where the semiconductor element is mounted; and a supporting plate configured to support the resin substrate;

wherein a first gas discharging hole is made through the supporting plate, and gas generated from the resin substrate is discharged through the first gas discharging hole.

According to the above-mentioned invention, gas generated from the resin substrate is discharged through the first gas discharging hole which is made through the supporting plate. Therefore, it is possible to prevent the resin substrate from being damaged due to the gas generated from the resin substrate and prevent the resin substrate and the supporting plate from peeling due to the gas generated from the resin substrate, so that it is possible to improve reliability of the semiconductor device.

The semiconductor device may further include:

a heat radiation member thermally connected to the semiconductor element and configured to radiate heat generated from the semiconductor element;

wherein the heat radiation member is separated from an opening part of the first gas discharging hole.

According to the above-mentioned invention, heat generated from the semiconductor element is radiated by the heat radiation member. Hence, it is possible to prevent the semiconductor element from working wrongly due to the heat. In addition, the gas generated from the resin substrate is discharged through the first gas discharging hole which is made through the supporting plate and the heat radiation member is separated from the opening part of the first gas discharging hole. Hence, the discharge of the gas is not obstructed by the heat radiation member. Accordingly, it is possible to prevent the semiconductor element from working wrongly due to the heat, and also possible to prevent the resin substrate from being damaged due to the gas and prevent the resin substrate and the supporting plate from peeling due to the gas.

The semiconductor device may further include:

a second gas discharging hole is formed in the resin substrate;

wherein gas discharged in the substrate is discharged to an outside of the substrate via the second gas discharging hole, and the second gas discharging hole faces the first gas discharging hole.

According to the above-mentioned invention, since the second gas discharging hole is formed in the resin substrate, the gas generated from the substrate is discharged to the outside of the substrate via the second gas discharging hole. Therefore, it is possible to prevent the resin substrate from being damaged due to the gas generated from the resin substrate. Furthermore, the second gas discharging hole formed in the resin substrate faces the first gas discharging hole formed in the supporting plate. Hence, the gas generated from the resin substrate and discharged to a surface of the substrate via the second gas discharging hole goes through the first gas discharging hole formed in the supporting plate and is discharged to the outside of the semiconductor device. Therefore, the gas discharged via the second gas discharging hole does not fill in a space between the resin substrate and the supporting plate, and thereby it is possible to prevent the resin substrate and the supporting plate from peeling due to the gas.

The semiconductor device may further include:

a cap configured to cover the resin substrate and the supporting plate;

wherein a third gas discharging hole is formed in the cap, and gas discharged from the first gas discharging hole is discharged to an outside of the cap via the third gas discharging hole.

According to the above-mentioned invention, the resin substrate and the supporting plate are protected by the cover configured to cover the resin substrate and the supporting plate. Therefore, it is possible to improve reliability of the semiconductor device. Furthermore, the gas generated from the resin substrate is discharged through the first gas discharging hole which is made through the supporting plate, the third gas discharging hole is formed in the cap configured to cover the resin substrate and the supporting plate, and the gas discharged from the first gas discharging hole is discharged to the outside of the cap via the third gas discharging hole. Because of this, it is possible to prevent the inside of the cap from being filled with the gas and prevent the cap from detaching from the semiconductor device.

The above-object of the present invention is achieved by a semiconductor device, including:

a semiconductor element;

a substrate where the semiconductor element is mounted; and a supporting plate configured to support the substrate, the supporting plate being fixed to the substrate by resin adhesive;

wherein a first gas discharging hole is made through the supporting plate, and gas generated from the resin adhesive is discharged through the first gas discharging hole.

According to the above-mentioned invention, gas generated from the resin adhesive is discharged through the first gas discharging hole which is made through the supporting plate. Therefore, it is possible to prevent the substrate and the supporting plate from peeling due to the gas generated from the resin adhesive, so that it is possible to improve reliability of the semiconductor device.

The semiconductor device may further include:

a heat radiation member thermally connected to the semiconductor element and configured to radiate heat generated from the semiconductor element;

wherein the heat radiation member is separated from an opening part of the first gas discharging hole.

According to the above-mentioned invention, heat generated from the semiconductor element is radiated by the heat radiation member. Hence, it is possible to prevent the semiconductor element from working wrongly due to the heat. In addition, the gas generated from the resin adhesive is discharged through the first gas discharging hole which is made through the supporting plate and the heat radiation member is separated from the opening part of the first gas discharging hole. Hence, the discharge of the gas is not obstructed by the heat radiation member. Accordingly, it is possible to prevent the semiconductor element from working wrongly due to the heat, and also possible to prevent the substrate and the supporting plate from peeling due to the gas.

The semiconductor device may further include:

a cap configured to cover the substrate and the supporting plate;

wherein a third gas discharging hole is formed in the cap, and gas discharged from the first gas discharging hole is discharged to an outside of the cap via the third gas discharging hole.

According to the above-mentioned invention, the substrate and the supporting plate are protected by the cover configured to cover the substrate and the supporting plate. Therefore, it is possible to improve reliability of the semiconductor device. Furthermore, the gas generated from the resin adhesive is discharged through the first gas discharging hole which is made through the supporting plate, the third gas discharging hole is formed in the cap configured to cover the substrate and the supporting plate, and the gas discharged from the first gas discharging hole is discharged to the outside of the cap via the third gas discharging hole. Because of this, it is possible to prevent the inside of the cap from being filled with the gas and prevent the cap from detaching from the semiconductor device.

The above object of the present invention is also achieved by a supporting plate provided in a semiconductor device including a semiconductor element and a resin substrate where the semiconductor element is mounted, the supporting plate being configured to support the resin substrate, the supporting plate including:

a piercing hole configured to discharge gas generated from the resin substrate.

According to the above-mentioned invention, gas generated from the resin substrate is discharged through the piercing hole which is made through the supporting plate. Therefore, it is possible to prevent the resin substrate from being damaged due to the gas generated from the resin substrate and prevent the resin substrate and the supporting plate from peeling due to the gas generated from the resin substrate, so that it is possible to improve reliability of the semiconductor device.

Other objects, features, and advantages of the present invention will become more apparent from the following detailed description when read in conjunction with the accompanying drawings.

DETAILED DESCRIPTION OF THE PREFERED EMBODIMENTS

A description is next given, with reference to FIG. 3 through FIG. 7, of embodiments of the present invention.

Figure 3:
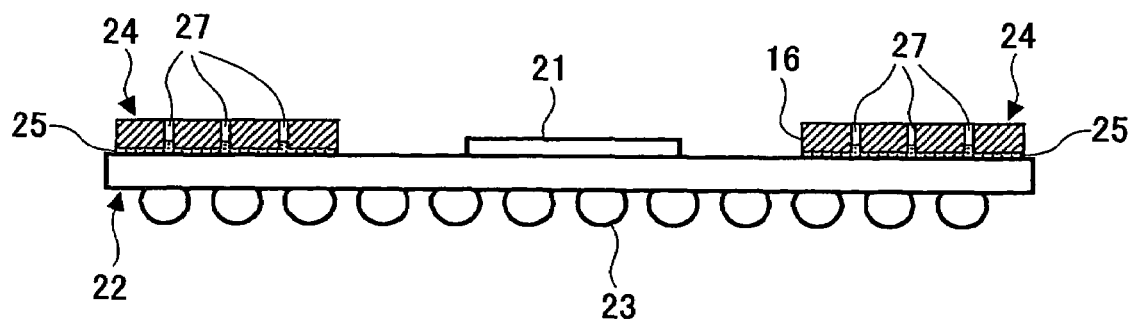
FIG. 3 is a front view of a semiconductor device of a first embodiment of the present invention.
Figure 4:
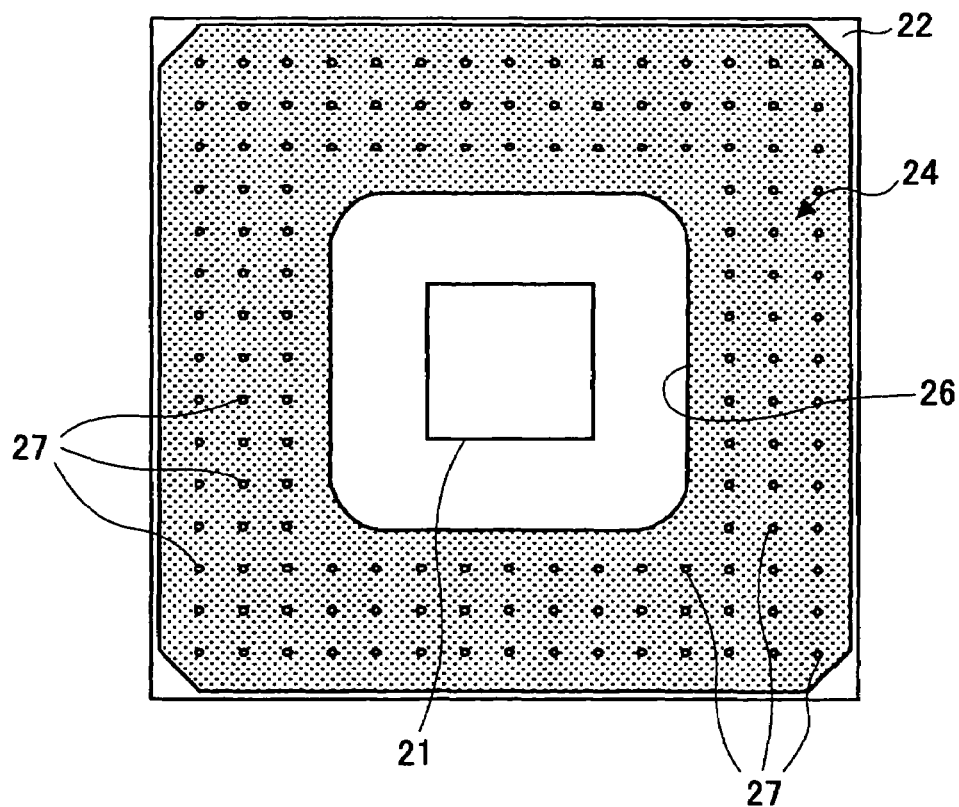
FIG. 4 is a plan view of the semiconductor device of the first embodiment of the present invention.
Figure 5:
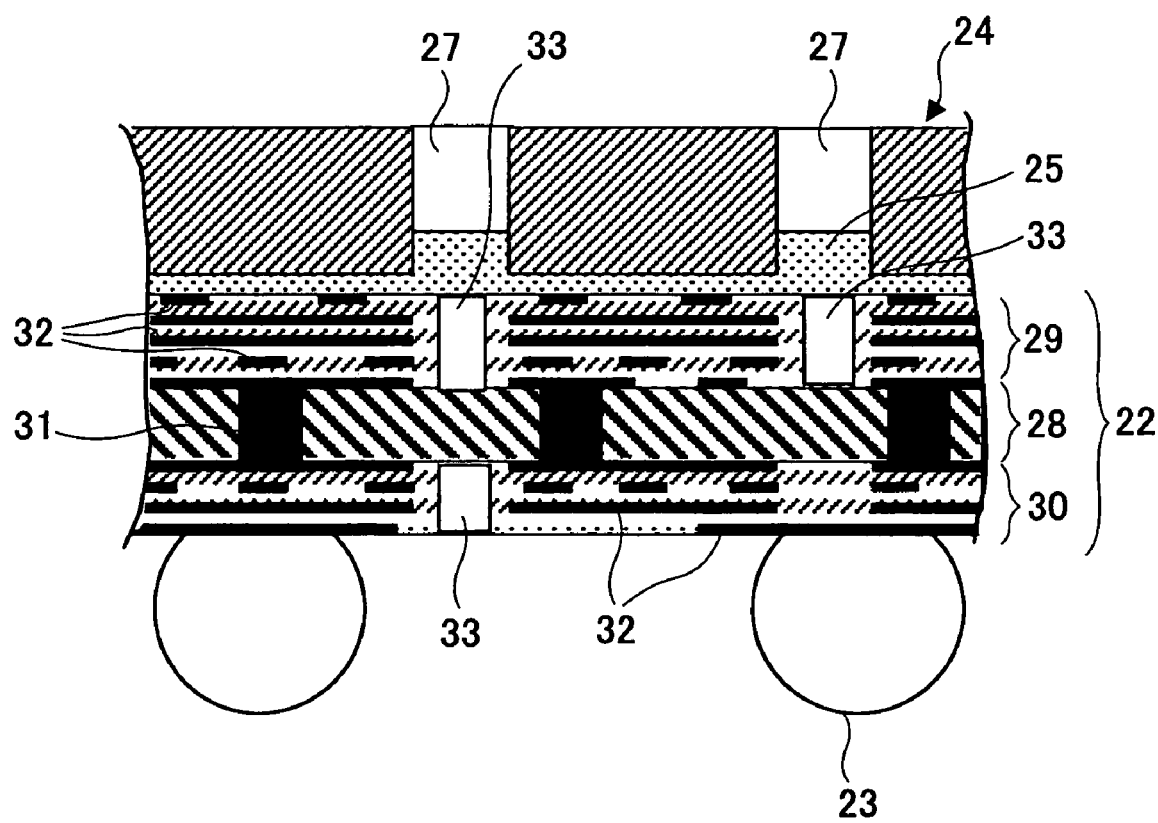
FIG. 5 is a cross-sectional view of the semiconductor device of the first embodiment of the present invention.

FIG. 3 through FIG. 5 show a semiconductor device 20A and a stiffener 24 as a supporting plate of a first embodiment of the present invention. More specifically, FIG. 3 is a front view of the semiconductor device 20A, FIG. 4 is a plan view of the semiconductor device 20A, and FIG. 5 is a cross-sectional view of the semiconductor device 20A wherein main parts of the semiconductor device 20A are enlarged. For the convenience of explanation, a cross section of the stiffener 24 is shown in FIG. 3.

The semiconductor device 20A of this embodiment has a BGA package structure. The semiconductor device 20A includes a semiconductor element 21, a resin substrate 22, solder balls 23, and the stiffener 24, and others.

The semiconductor element 21 is flip-chip connected to the center of the resin substrate 22 by bumps (not shown in FIG. 3 through FIG. 5) formed on a circuit forming surface. In addition, plural solder balls 23 as external connection terminals are provided on a lower surface of the resin substrate 22.

The resin substrate 22 is formed as a multilayer wiring substrate. More specifically, the resin substrate 22 has a structure where wiring layers, via forming parts interfacially connecting the wiring layers, and others are formed in a base material made of an organic resin material. The resin substrate 22 is enlarged as shown in FIG. 5.

As shown in FIG. 5, the resin substrate 22 includes a core substrate part 28 and built-up wiring parts 29 and 30. The core substrate part 28 is a substrate functioning as a base of the built-up wiring parts 29 and 30. The core substrate part 28 is, for example, formed by a multi-layer substrate where a resin layer made of epoxy resin, BT resin, or the like is multi-layered.

Through hole forming parts 31 are formed at designated positions of the core substrate part 28 so as to electrically connect the built-up wiring parts 29 and 30 between which the core substrate part 28 is put. The built-up wiring parts 29 and 30 are formed on the core substrate part 28 by using a thin film forming technology so as to form a multi-layer structure wherein the wiring layers 32 and resin layers as insulation layers are stacked by turns.

Furthermore, the wiring layers 32 are interfacially connected at a designated position by via forming parts (not shown in FIG. 5). The semiconductor element 21 and the solder balls 23 are electrically connected by the through hole forming parts 31, the wiring layers 32 and the via forming parts.

In the meantime, since a main component of the resin substrate 22 is resin, the resin substrate 22 absorbs moisture. More specifically, in a case where the resin layer made of epoxy resin, BT resin, or the like is used for the resin of the resin substrate 22, there is a hygroscopicity of approximately 0.2 through 0.3%. Due to gasification of the moisture-absorbing component, damage may be generated in the semiconductor device 20A, as described above.

Because of this, second gas discharging holes 33 are formed at a designated position of the resin substrate 22 used in this embodiment. At the same time when the built-up wiring parts 29 and 30 are formed, the second gas discharging holes 33 are formed. Thus, even if the moisture absorption component existing in a deep position from a surface of the resin substrate 22 is gasified, the generated gas can be discharged to the outside of the resin substrate 22 via the second gas discharging holes 33 by forming the second gas discharging holes 33 in the resin substrate 22.

As described above, a high co-planarity (flatness) is required in the resin substrate 22, to improve mounting reliability when the semiconductor device 20A is mounted on a mounting substrate (not shown) and improve connection reliability when the semiconductor element 21 is flip-chip connected to the resin substrate 22. Because of this, the semiconductor device 20A of this embodiment has a structure where the stiffener 24 is provided on the resin substrate 22.

The stiffener 24 is a member having a plate-shaped configuration and functions as a supporting plate configured to support the resin substrate 22. As shown in FIG. 4, the stiffener 24 has an area having the substantially same size as the resin substrate 22. An opening part 26 is formed in the center of the stiffener 24 so that the semiconductor element 21 can be mounted on the resin substrate 22 in the opening part 26. To improve the connection reliability, the stiffener 24 is flip-chip connected to the resin substrate 22 after the stiffener 24 is fixed to the resin substrate 22.

As a material of the stiffener 24, a material having a thermal expansion coefficient close to that of the resin substrate 22 and having a high rigidity (Young's modulus) is used. More specifically, copper (Cu), stainless (SUS), aluminum (Al), or the like can be used as the material of the stiffener 24. The stiffener 24 having the above-discussed structure is adhered to the resin substrate by an epoxy group resin adhesive 25 (hereinafter "resin adhesive 25"), for example.

Meanwhile, the semiconductor element 21 used in this embodiment has a high density and therefore has a large number of the external connection terminals (solder balls 23). Therefore, the sizes of the resin substrate 22 and stiffener 24 become large so that an adhesive area of the resin substrate 22 and the stiffener 24 is increased.

Figure 1:
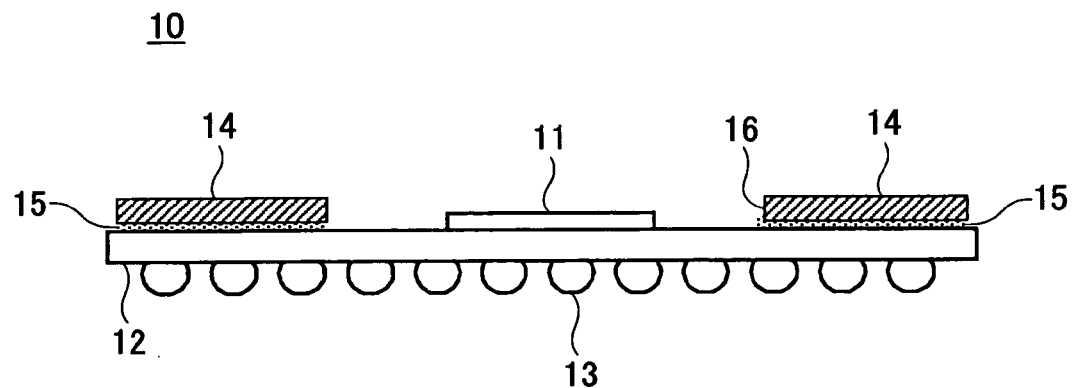
FIG. 1 is a front view of an example of a related art semiconductor device.
Figure 2:
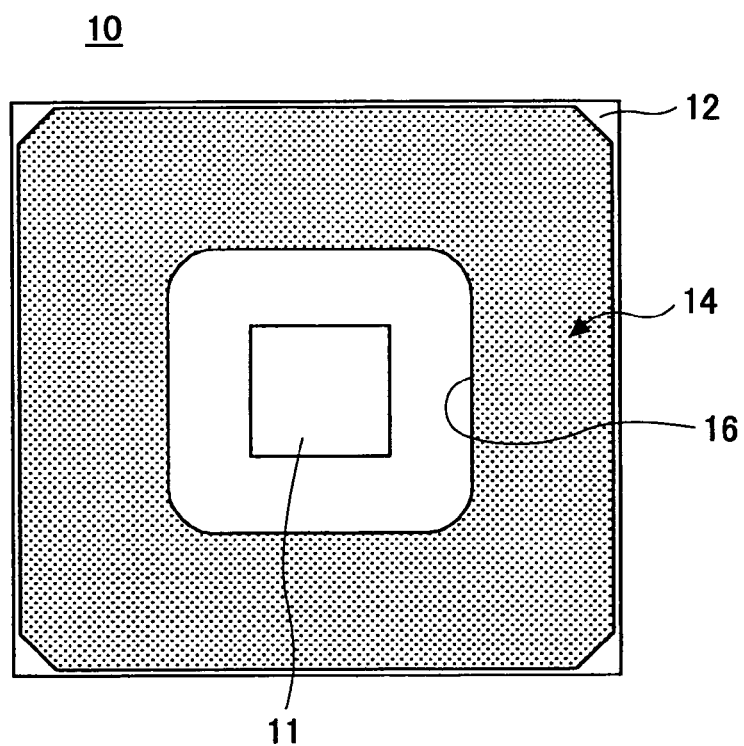
FIG. 2 is a plan view of the example of the related art semiconductor device.

As described above, in a case where the stiffener 14 (See FIG. 1 and FIG. 2) is formed by a simple plate material as discussed in the related art, there is no path for discharging the gas when the moisture absorbed at the resin substrate 12 and the resin adhesive 15 are gasified. Therefore, there are problems in the related art in that damage such as inter layer peeling or disconnection may be generated in the resin substrate 12 and peeling may be generated at a connection part between the resin substrate 12 and the stiffener 14.

On the other hand, in the semiconductor device 20A of this embodiment of the present invention, first gas discharging holes 27 are formed in the stiffener 24. More specifically, the first gas discharging hole 27 is made through (pierces) the stiffener 24. The first gas discharging hole 27 can be formed by a well-known mechanical processing such as drilling or laser processing at a relatively low cost.

In addition, the first gas discharging hole 27 faces the second gas discharging hole 33 formed in the resin substrate 22. More specifically, a center axis of the first gas discharging hole 27 is consistent with a center axis of the second gas discharging hole 33.

Furthermore, a diameter of the first gas discharging hole 27 is set to be larger than a diameter of the second gas discharging hole 33. The difference between the diameter of the first gas discharging hole 27 and the diameter of the second gas discharging hole 33 is set to be larger than a value of an arrangement error in a case where the stiffener 24 is arranged on the resin substrate 22.

Even if the moisture absorption component existing in the resin substrate 22 or the resin adhesive 25 is gasified, the generated gas can be discharged to the outside via the first gas discharging hole 25 formed in the stiffener 24. Therefore, it is possible to prevent the resin substrate 22 from being damaged due to the gas generated from the resin substrate 22 or the resin adhesive 25 and prevent the resin substrate 22 and the stiffener 24 from peeling due to the gas, so that it is possible to improve the reliability of the semiconductor device 20A.

In addition, in this embodiment, the first gas discharging hole 27 formed in the stiffener 24 faces the second gas discharging hole 33 formed in the resin substrate 22. Hence, the gas generated from the resin substrate 22 is discharged to the outside of the resin substrate 22 via the second gas discharging hole 33.

Furthermore, since the first gas discharging hole 27 faces the second gas discharging hole 33, the gas discharged to a substrate surface via the second gas discharging hole 33 goes through the first gas discharging hole 27 so as to be discharged to the outside of the stiffener 24 (semiconductor device 20A). Therefore, the gas discharged via the second gas discharging hole 33 does not fill in a space between the resin substrate 22 and the stiffener 24, and thereby it is possible to prevent the resin substrate 22 and the stiffener 24 from peeling due to the gas.

The resin adhesive 25 is provided between the resin substrate 22 and the stiffener 24. However, since the resin adhesive 25 is thin and made of resin, the resin adhesive 25 has a property whereby gas goes through. Therefore, flow of the gas going from the second gas discharging hole 33 to the first gas discharging hole 27 is not obstructed by the resin adhesive 25. The gas generated from the resin substrate 22 is discharged to the outside of the semiconductor device 20A via the first gas discharging hole 27.

Next, the second embodiment of the present invention is discussed.

Figure 6:
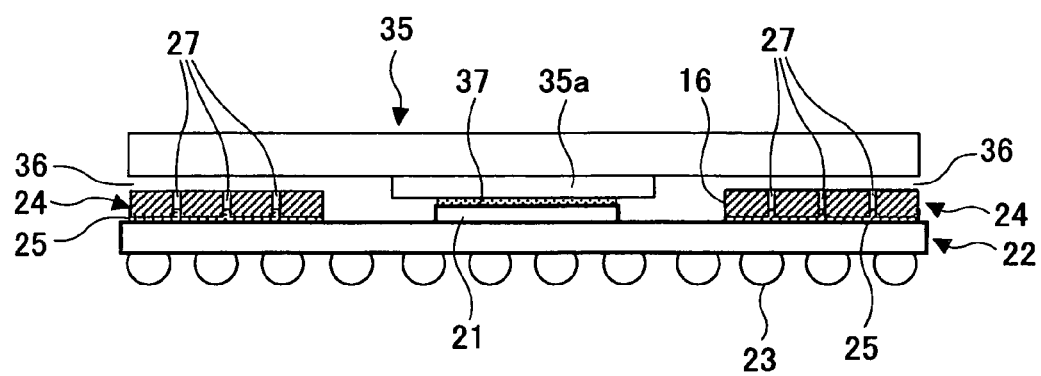
FIG. 6 is a front view of a semiconductor device of a second embodiment of the present invention.

FIG. 6 is the front view of a semiconductor device 20B of the second embodiment of the present invention. In FIG. 6, parts that are the same as the parts shown in FIG. 3 through FIG. 5 of the first embodiment are given the same reference numerals, and explanation thereof is omitted.

The semiconductor device 20B of this embodiment includes a heat spreader 35. The heat spreader 35 is made of a material having a good thermal conductivity, such as copper (Cu), aluminum (Al), or the like.

Heat generated from the semiconductor element 21 is radiated by the heat spreader 35 and therefore the heat spreader 35 is thermally connected to the semiconductor element 21. More specifically, the heat spreader has a projection part 35a projecting downward. The projection part 35a is adhered to the semiconductor element 21 via a thermal conductive adhesive 37.

Thus, in this embodiment, the heat spreader 35 is connected to the semiconductor element 21 both thermally and mechanically. The heat spreader 35 is separated from the stiffener 24 (its cross-section is shown in FIG. 6). That is, the heat spreader 35 is separated from the opening part of the first gas discharging hole 27 formed in the stiffener 24.

According to the semiconductor device 20B of this embodiment, heat generated from the semiconductor element 21 is radiated by the heat spreader 35 functioning as a heat radiation member. Hence, it is possible to prevent the semiconductor element 21 from working wrongly due to the heat.

The gas generated from the resin substrate 22 and the resin adhesive 25 is discharged from the first gas discharging hole 27 formed in the stiffener 24. In this embodiment, since the heat spreader 35 is separated from the opening part of the first gas discharging hole 27, the heat spreader 35 does not obstruct the discharge of the gas.

In addition, a gap forming part 36 is formed at an outer periphery and between the stiffener 24 and the heat spreader 35. Hence, the gas discharged from the first gas discharging hole 27 is discharged to an outside of the semiconductor device 20B via the gap forming part 36. Accordingly, in the semiconductor device 20B of this embodiment, it is possible to prevent the semiconductor element 21 from working wrongly due to the heat, and also possible to prevent the resin substrate 22 from being damaged due to the gas and prevent the resin substrate 22 and the stiffener 24 from peeling due to the gas.

The height of the gap forming part 36, namely the gap length between an opening part of the first gas discharging hole 27 and the heat spreader 35, can be set at will by adjusting the height of the projection part 35a. The height of the gap forming part 36 is set smallest in a range whereby the gas discharged via the first gas discharging hole 27 can be surely discharged to the outside. Thus, the semiconductor device 20B can be made minimum.

Next, the third embodiment of the present invention is discussed.

Figure 7:
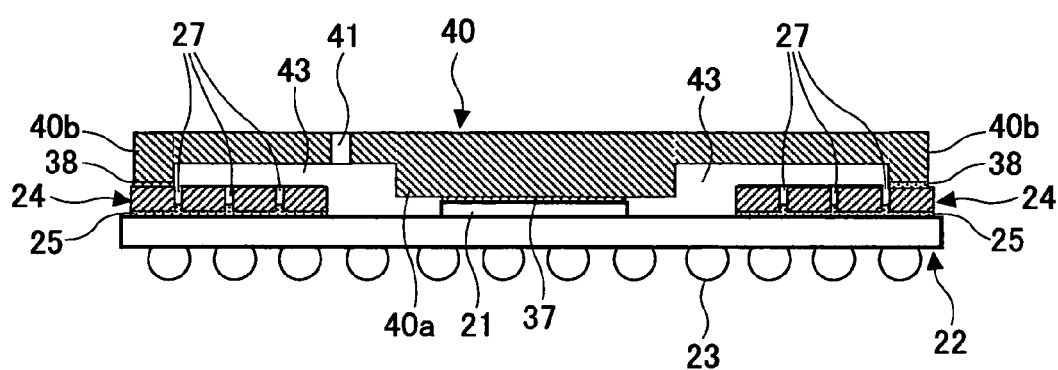
FIG. 7 is a front view of a semiconductor device of a third embodiment of the present invention.

FIG. 7 is a front view of a semiconductor device 20C of the third embodiment of the present invention. In FIG. 7, parts that are the same as the parts shown in FIG. 3 through FIG. 5 of the first embodiment are given the same reference numerals, and explanation thereof is omitted. The semiconductor device 20C includes a cap 40 (a cross section of the cap 40 is shown in FIG. 7).

The cap has a function whereby heat generated from the semiconductor element 21 can be radiated. In addition to the above-mentioned heat radiation function, the cap 40 has a function whereby the resin substrate 22 and the stiffener 24 can be protected.

Because of this, the projection part 40a provided in the center of the cap 40 and projecting downward is adhered and thermally connected to the semiconductor element 21 via a thermal conductive adhesive 37. In addition, a stand part 40b provided at an outer periphery of the cap 40 and projecting downward is fixed to the stiffener 24 by the adhesive 38. Thus, the projection part 40a is thermally connected to the semiconductor element 21 so that heat generated from the semiconductor element 21 is radiated by the cap 40.

Furthermore, the resin substrate 22 and an upper part of the stiffener 24 are covered with the cap 40 by the stand part 40b adhering to the stiffener 24. Because of this, the resin substrate 22 and the stiffener 24 are covered with the cap 40 and therefore it is possible to improve reliability of the semiconductor device 20C.

In addition, a gap forming part 43 is formed between an opening part of the first gas discharging hole 27 and the cap 40 in a state where the cap 40 is provided. A third gas discharging hole 41 connected to the gap forming part 43 is formed in the cap 40.

Accordingly, the gas generated from the resin substrate 22 and the resin adhesive 25 is discharged to the gap forming part 43 via the first gas discharging hole 27 formed in the stiffener 24 and then discharged to the outside of the semiconductor device 20C via the third gas discharging hole 41 formed in the cap 40. Therefore, it is possible to prevent the inside of the cap 40 from being filled with the gas and prevent the cap 40 from being detached from the semiconductor device 20C (stiffener 24) due to gas pressure, while the cap 40 is provided in the semiconductor device 20C.

The present invention is not limited to these embodiments, but variations and modifications may be made without departing from the scope of the present invention.

For example, in the above-discussed embodiments, the semiconductor devices 20A through 20C having the BGA package structure are discussed. However, the present invention can be applied to other package structures such as the LGS package structure as long as a stiffener is used.

In addition, in the above-discussed embodiments, a structure wherein gas is generated from both the substrate (resin substrate 22) and the resin adhesive 25 is discussed. However, the present invention is not limited to this structure. It is not necessary to form both the substrate and the adhesive by the resin. For example, the present invention can be applied to a case where a substrate such as a ceramic substrate which may not be subject to moisture absorption is used, or a case where the ceramic substrate and the supporting plate are adhered by the resin adhesive.

What is claimed is:

1. A semiconductor device, comprising:
   a semiconductor element;
   a resin substrate where the semiconductor element is mounted;
   a supporting plate supporting the resin substrate and surrounding the semiconductor element;
   a first gas discharging hole extending through the supporting plate; and
   a second gas discharging hole formed in the resin substrate; wherein
   gas generated from the resin substrate is discharged through the first gas discharging hole;
   gas discharged in the substrate is discharged to the outside of the substrate via the second gas discharging hole; and
   the second gas discharging hole faces the first gas discharging hole.

2. The semiconductor device as claimed in claim 1, further comprising:
   a heat radiation member thermally connected to the semiconductor element and configured to radiate heat generated from the semiconductor element; and
   the heat radiation member being separated from an opening part of the first gas discharging hole.

3. The semiconductor device as claimed in claim 1, further comprising:
   a cap covering the resin substrate and the supporting plate;
   a third gas discharging hole in the cap, and
   gas discharged from the first gas discharging hole being dischargeable to an outside of the cap via the third gas discharging hole.

4. A semiconductor device supporting a semiconductor element, comprising:
   a supporting plate having a first gas discharging hole extending therethrough and surrounding a semiconductor element; and
   a resin substrate having a second gas discharging hole formed therein; wherein
   gas generated from the resin substrate is discharged through the first gas discharging hole; and
   gas discharged in the substrate is discharged to the outside of the substrate via the second gas discharging hole; and
   the second gas discharging hole faces the first gas discharging hole.

* * * * *